United States Patent
Wang

(10) Patent No.: US 8,828,771 B2
(45) Date of Patent: Sep. 9, 2014

(54) SENSOR MANUFACTURING METHOD

(71) Applicant: Chuan-Wei Wang, Taoyuan (TW)

(72) Inventor: Chuan-Wei Wang, Taoyuan (TW)

( * ) Notice: Subject to any disclaimer, the term of this patent is extended or adjusted under 35 U.S.C. 154(b) by 0 days.

(21) Appl. No.: 13/679,322

(22) Filed: Nov. 16, 2012

(65) Prior Publication Data

US 2013/0126990 A1    May 23, 2013

(30) Foreign Application Priority Data

Nov. 18, 2011   (TW) .............................. 100142335 A

(51) Int. Cl.
| | |
|---|---|
| *H01L 21/66* | (2006.01) |
| *H01L 29/84* | (2006.01) |
| *H04R 19/00* | (2006.01) |
| *H01L 21/768* | (2006.01) |
| *B81C 1/00* | (2006.01) |
| *H04R 31/00* | (2006.01) |
| *H04R 19/04* | (2006.01) |

(52) U.S. Cl.
CPC ........ *H01L 21/76898* (2013.01); *H04R 19/005* (2013.01); *B81B 2201/0257* (2013.01); *H04R 19/04* (2013.01); *B81C 1/00182* (2013.01); *H01L 29/84* (2013.01); *H04R 31/00* (2013.01)
USPC .. 438/50; 438/10; 257/E21.531; 257/E29.324

(58) Field of Classification Search
None
See application file for complete search history.

(56) References Cited

U.S. PATENT DOCUMENTS

| | | | |
|---|---|---|---|
| 7,621,183 B2 | 11/2009 | Seeger et al. | |
| 2009/0067033 A1* | 3/2009 | Kajino et al. | 359/291 |
| 2009/0317931 A1* | 12/2009 | Perruchot et al. | 438/50 |

OTHER PUBLICATIONS

Graham, A.B. et al., "Wafer Scale Encapsulation of Large Lateral Deflection MEMS Structures", Micro Electro Mechanical Systems, 2009. MEMS 2009. IEEE 22nd International Conference on, Date of Conference: Jan. 25-29, 2009, p. 745-p. 748.

* cited by examiner

*Primary Examiner* — Kevin M Picardat
*Assistant Examiner* — Pamela E Perkins
(74) *Attorney, Agent, or Firm* — Muncy, Geissler, Olds & Lowe, P.C.

(57) ABSTRACT

A sensor manufacturing method and a microphone structure produced by using the same. Wherein, thermal oxidation method is used to form a sacrifice layer of an insulation layer on a silicon-on-insulator (SOI) substrate or a silicon substrate, to fill patterned via in said substrate. Next, form a conduction wiring layer on the insulation layer. Since the conduction wiring layer is provided with holes, thus etching gas can be led in through said hole, to remove filling in the patterned via, to obtain an MEMS sensor. Or after etching of the conduction wiring layer, deep reactive-ion etching is used to etch the silicon substrate into patterned via, to connect the substrate electrically to a circuit chip. The manufacturing process is simple and the technology is stable and mature, thus the conduction wiring layer and the insulation layer are used to realize electrical isolation.

9 Claims, 14 Drawing Sheets

SENSOR MANUFACTURING METHOD

BACKGROUND OF THE INVENTION

1. Field of the Invention

The present invention relates to a sensor technology, and in particular to a sensor manufacturing method and a microphone structure made by using the same.

2. The Prior Arts

In the past thirty years, the complementary metal oxide semiconductor (CMOS) has been used extensively in the manufacturing of Integrated Circuits (IC). The development and innovation of IC have progressed by leaps and bounds, due to huge amount of research manpower and investment put in, to raise significantly its reliability and yields; meanwhile, its production cost is reduced drastically. Presently, that technology has reached a mature and stable level, such that for the continued development of the semiconductor, in addition to keeping up the present trend of technical development, it is essential to achieve breakthrough to provide special production process, and enhance system integration of high concentration.

In this respect, the Micro Electro-Mechanical System (MEMS) is a new processing technology completely different from the convention technology. It mainly utilizes the semiconductor technology to produce MEMS structure; meanwhile it is capable of making products having electronic and mechanical functions. As such, it has the advantages of batch processing, miniaturization, and high performance, and is very suitable for use in Production Industries requiring mass production at reduced cost. Therefore, for this stable and progressing CMOS technology, the integration of MEMS and circuitry can be a better approach to achieve system integration.

For the processing of most of the MEMS elements, polysilicon is utilized to make active elements, such that it utilizes one or more oxides as the release layer, the silicon nitride as the isolation layer, and metal layer as a reflector and internal connection. In processing the MEMS elements, it could encounter an especially difficult release problem, such that in this process, a silicon oxide sacrifice layer is dissolved, and a gap thus created is to separate various elements. In this respect, the MEMS elements, including the electrostatic suspension arms, the deflection mirrors, and the torsion regulator are released through dissolving the sacrifice layer by means of the wet chemical process. In general, that process is performed on a single piece of MEMS circuit chip, rather on a whole wafer. At this time, the static friction is liable to cause decrease of yield. The static friction refers to two adjacent surfaces stick to each other, as caused by the capillary forces produced by drying up the liquid between two micro-structures, thus leading to decrease of yield. Most of the MEMS elements are made through using oxide sacrifice layers. Usually, a water containing hydrofluoric acid is used to dissolve an oxide sacrifice layer to achieve release. In another approach, a hydrofluoric acid vapor is used to release MEMS elements having oxide sacrifice layer.

In a thesis of Stanford University, "Wafer Scale Encapsulation Of Large Lateral Deflection MEMS Structure", the MEMS element is produced by first performing Deep Reactive-Ion Etching of a silicon-on-insulator (SOI) substrate. Next, grow a layer of silicon dioxide thereon, and then planarize its surface. Subsequently, form a first epitaxy layer, and then perform deep reactive-ion etching to remove a part of the silicon layer. Finally, grow a second epitaxy layer to seal off the etched holes on the first epitaxy layer, to form an electrode serving as a connection pad. In addition, in U.S. Pat. No. 7,621,183, another MEMS element manufacturing method is disclosed. Wherein, firstly, form an oxide layer on a cap wafer, then form a balance structure and a germanium layer on a gyroscope wafer, to connect the gyroscope wafer onto the cap wafer. Finally, connect a reference wafer electrically to the germanium layer, to fix it on the gyroscope wafer. From the descriptions above it can be known that, the former cited case utilizes the epitaxy technology requiring high price metal; while for the latter cited case, its production process is rather complicated.

Therefore, presently, the design and performance of the MEMS element manufacturing method is not quite satisfactory, and it has much room for improvements.

SUMMARY OF THE INVENTION

In view of the problems and shortcomings of the prior art, the present invention provides a sensor manufacturing method and a microphone structure made by using the same, that is simple in implementation, to overcome the deficiency and drawback of the prior art.

A major objective of the present invention is to provide a sensor manufacturing method, that utilizes the stable and mature technology, such as thermal oxidation method, metal wiring, deep reactive-ion etching, and Plasma Enhanced Chemical Vapor Deposition (PECVD), to realize cost reduction and replace the exitaxial technology, and provide various types of manufacturing processes; meanwhile achieving voltage separation through a conduction wiring layer.

In order to achieve the above objective, the present invention provides a sensor manufacturing method, comprising the following steps. Firstly, provide a silicon-on-insulator (SOI) substrate, a silicon layer of the silicon-on-insulator (SOI) substrate is provided with at least a trench penetrating itself. Then, provide at least a patterned via penetrating the silicon layer, and form a sacrifice layer on the silicon layer by means of a thermal oxidation method, to fill the trench and the patterned via. Subsequently, remove a part of the sacrifice layer, to expose the silicon layer, and also form a conduction wiring layer on the sacrifice layer, to connect electrically to the silicon layer. Wherein, the top surface of the conduction wiring layer is provided with at least a hole, with its position corresponding to that of the patterned via. Finally, through the hole, remove the sacrifice layer in the patterned via.

The present invention also provides another sensor manufacturing method, comprising the following steps. Firstly, provide a silicon substrate, that is provided with at least a trench penetrating itself. Then, utilize a thermal oxidation method to form a sacrifice layer on the silicon substrate, to fill the trench; or use PECVD to fill the trench. Subsequently, remove a part of the sacrifice layer, to expose the silicon substrate, and form a conduction wiring layer on the sacrifice layer, to connect electrically to the silicon substrate. Wherein the top surface of the conduction wiring layer is provided with at least a hole, with its position corresponding to that of the sacrifice layer on the inner side of the conduction wiring layer. Through the hole, the sacrifice layer on the inner side of the conduction wiring layer can be removed. After the removal, form at least a patterned via penetrating the silicon substrate by means of deep reactive-ion etching.

Moreover, the present invention provides a microphone structure, including a silicon substrate, and is provided with an opening. On the silicon substrate is provided with a silicon layer. The silicon layer includes at least a first silicon block and at least a second silicon block, such that they are spaced by at least two different co-planar gaps, and connects with the opening.

Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from this detailed descriptions.

BRIEF DESCRIPTION OF THE DRAWINGS

The related drawings in connection with the detailed descriptions of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

The present invention relates to a Micro Electro-Mechanical System (MEMS) sensor manufacturing method, that utilizes the stable and mature technology, such as thermal oxidation method, metal wiring, deep reactive-ion etching, and Plasma Enhanced Chemical Vapor Deposition (PECVD), to realize cost reduction and replace the epitaxy technology, and provide various types of manufacturing processes; meanwhile achieving voltage separation through a conduction wiring layer.

Figure 1A:
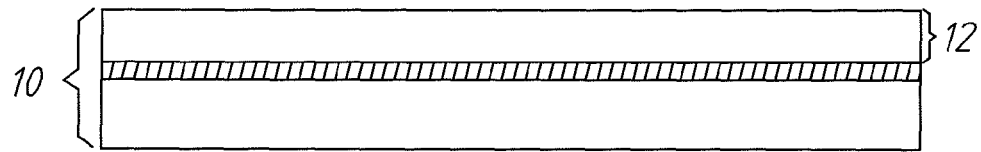
FIGS. 1(a) to 1(m) are cross section views of structures corresponding to various steps of a sensor manufacturing method according to a first embodiment of the present invention.
Figure 1B:
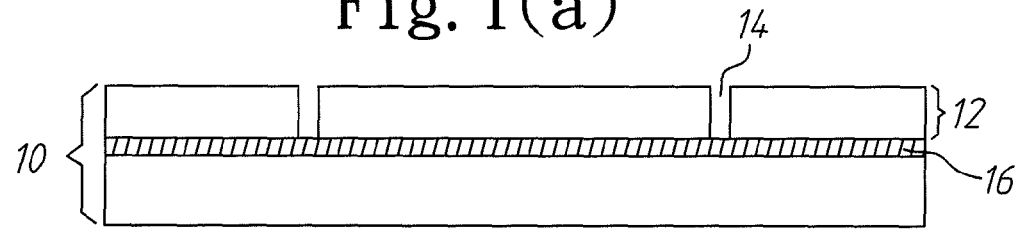
Figure 1C:
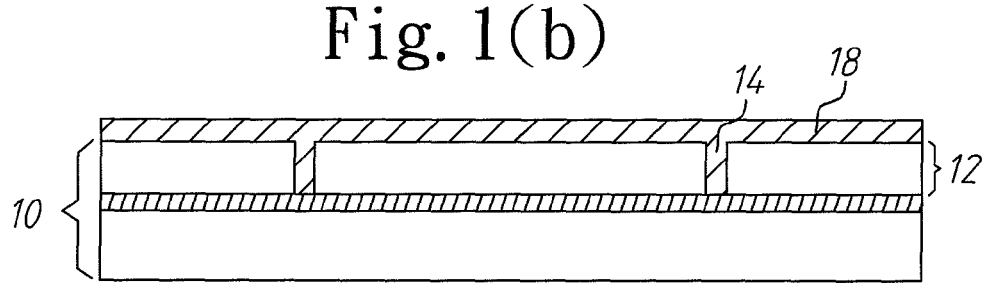
Figure 1D:
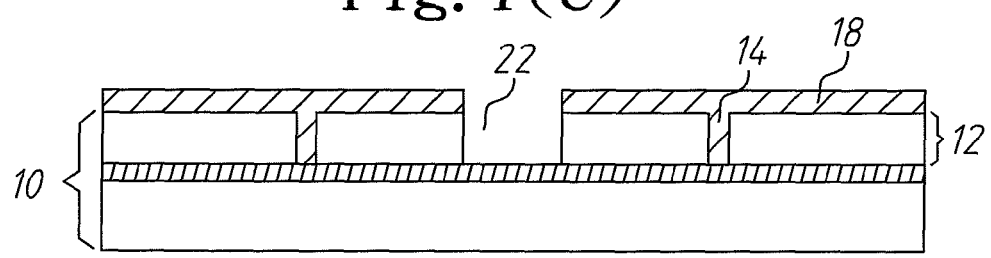
Figure 1E:
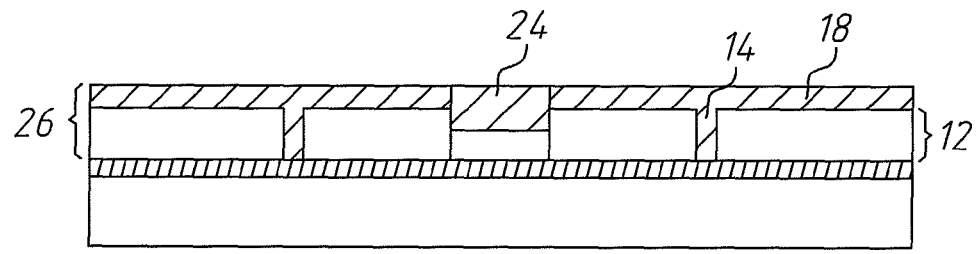

Refer to FIGS. 1(a) to 1(m) for cross section views of structures corresponding to various steps of a sensor manufacturing method according to a first embodiment of the present invention. As shown in FIG. 1(a), firstly, provide a silicon-on-insulator (SOI) substrate 10, that is provided with a silicon layer 12. Next, as shown in FIG. 1(b), form at least a trench 14 penetrating the silicon layer 12 by means of a Deep Reactive-Ion Etching, to expose a silicon dioxide layer 16. Then, as shown in FIG. 1(c), utilize a thermal oxidation method or PECVD to form an oxidation layer 18 on the silicon layer 12, to fill the trench 14. Subsequently, as shown in FIG. 1(d), utilize Reactive-Ion Etching (RIE) to dry etch and remove part of the oxidation layer 18, and utilize the Deep Reactive-Ion Etching to etch the silicon layer 12 below, to form at least a patterned via 22. Then, as shown in FIG. 1(e), fill a sacrifice structure 24 into the patterned via 22, to form a sacrifice layer 26 on the silicon layer 12. Namely, the sacrifice layer 26 includes the oxidation layer 18 and the sacrifice structure 24, and both can be made of silicon dioxide.

Figure 1F:
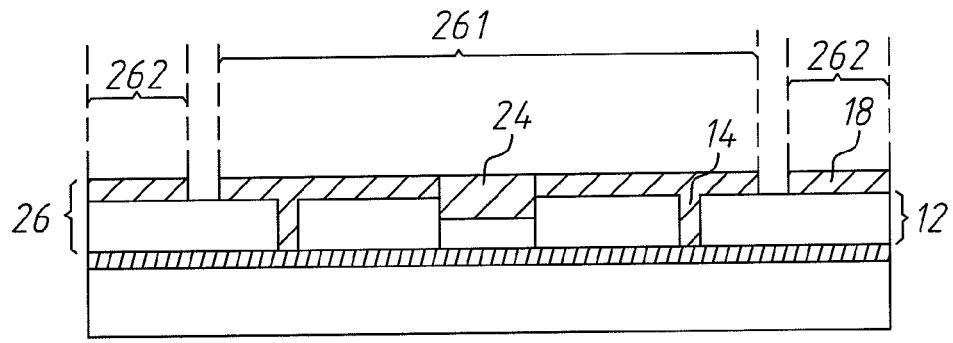
Figure 1G:
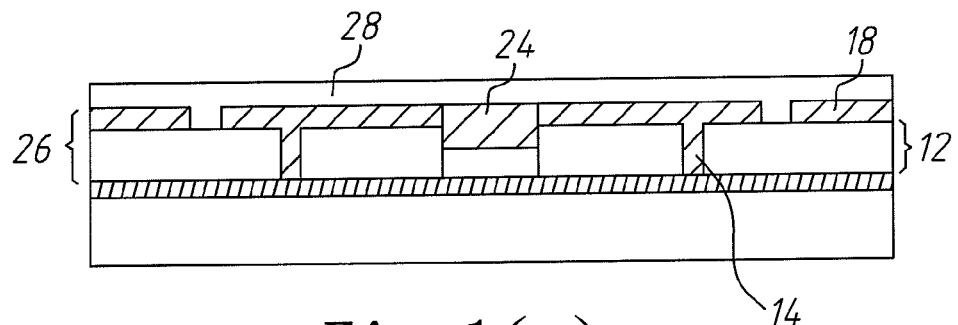
Figure 1H:
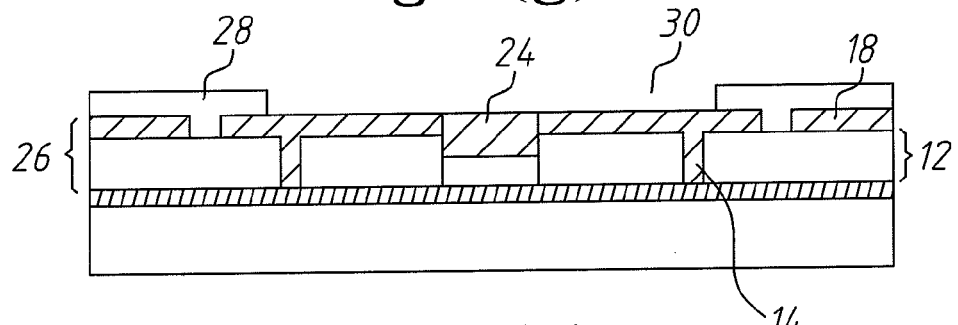
Figure 1I:
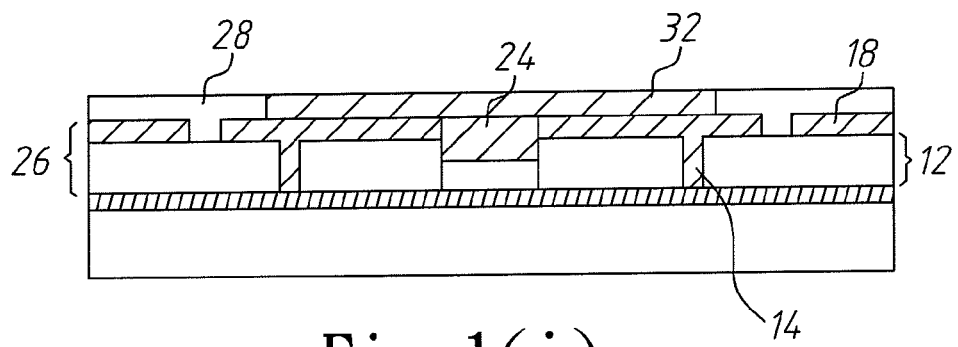
Figure 1J:
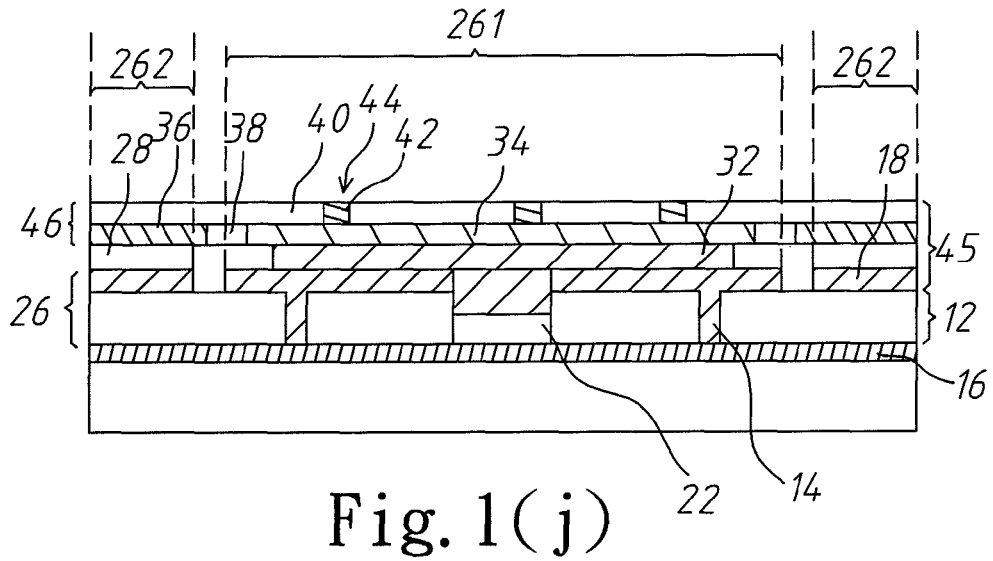

Upon finishing the sacrifice layer 26, as shown in FIG. 1(f), remove part of the sacrifice layer 26, to expose the silicon layer 12, to make the sacrifice layer 26 to have a first sacrifice layer 261 and the second sacrifice block 262, such that the latter is on the outer perimeter of the former. Wherein, for the requirement of the subsequent conduction wiring layer, adjustment can be made in the manufacturing process, so that the first sacrifice block 261 is made of silicon dioxide, while the second sacrifice block 262 is made of silicon dioxide, silicon carbide, or undoping polysilicon Then, as shown in FIG. 1(g), form a first metal layer 28 made of aluminum on the sacrifice layer 26, and connect it electrically to the silicon layer 12. Subsequently, as shown in FIG. 1(h), form at least an opening 30 on the first metal layer 28 corresponding to the patterned via 22 and the trench 14, to expose the sacrifice layer 26. Then, form a first insulation layer 32 made of silicon dioxide to fill the opening 30, as shown in FIG. 1(i). Afterwards, as shown in FIG. 1(j), form a first insulation block 34 made of silicon dioxide on the first insulation layer 32, and to form a second insulation block 36 made of silicon dioxide and a metal block 38 made of tungsten (W) on the first metal layer 28. The metal block 38 is used as a conduction via or conduction plug, such that the first insulation block 34, the second insulation block 36 are adjacent to the metal block 38, and are located inside and outside of the metal block 38, to form a second metal layer 40 made of aluminum and having at least a hole 42, on the first insulation block 34, the second insulation block 36, and the metal block 38. Wherein, the hole 42 is located corresponding to the patterned via 44 and the trench 14, and a second insulation layer 44 made of silicon dioxide is formed in the opening 42 to be located on the first insulation block 34, so as to form a conduction wiring layer 45 on the sacrifice layer 26.

Alternatively, as shown in the step of FIG. 1(j), a metal wiring layer 46 having an opening 42 and including the first insulation block 34, the second insulation block 36, the metal block 38, the second metal layer 40, and the second insulation layer 44 can be formed directly on the first insulation layer 32 and the first metal layer 28. Wherein, the relative positions of the first insulation block 34, the second insulation block 36, the metal block 38, the second metal layer 40, and the second insulation layer 44 are the same as mentioned above.

Figure 1K:
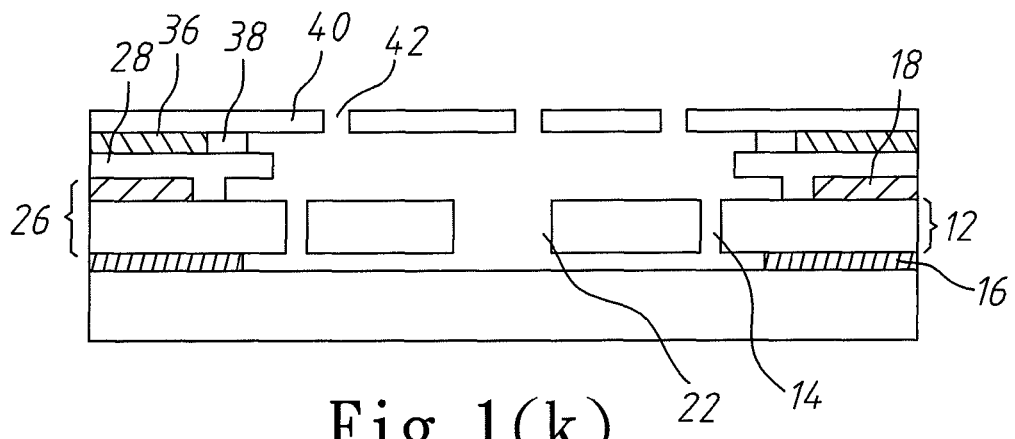

Upon forming the conduction wiring layer 45, as shown in FIG. 1(k), pour in the Hydrogen Fluoride (HF) vapor through the hole 42, or utilize wet etching through the hole 42, to remove in sequence the second insulation layer 44, the first insulation block 34, the first insulation layer 32, the sacrifice layer 26 inside the first metal layer 28, the sacrifice layer 26 in the patterned via 22, and the silicon dioxide layer 16 of the silicon-on-insulator (SOI) substrate 10. Meanwhile, remove the sacrifice layer 26 in the trench 14. The sacrifice layer 26 removed mentioned above is the part of the first sacrifice block 261.

In case the first sacrifice block 261 is not in contact with the trench 14, and the second sacrifice block 262 is in contact with the trench 14, so that the opening 30 and the hole 42 are not aligned with the trench 14, then in the step of FIG. 1(k), the sacrifice layer 26 in the trench 14 can not be removed.

In case it is desired to make other types of sensors, the following steps can be taken.

Figure 1L:
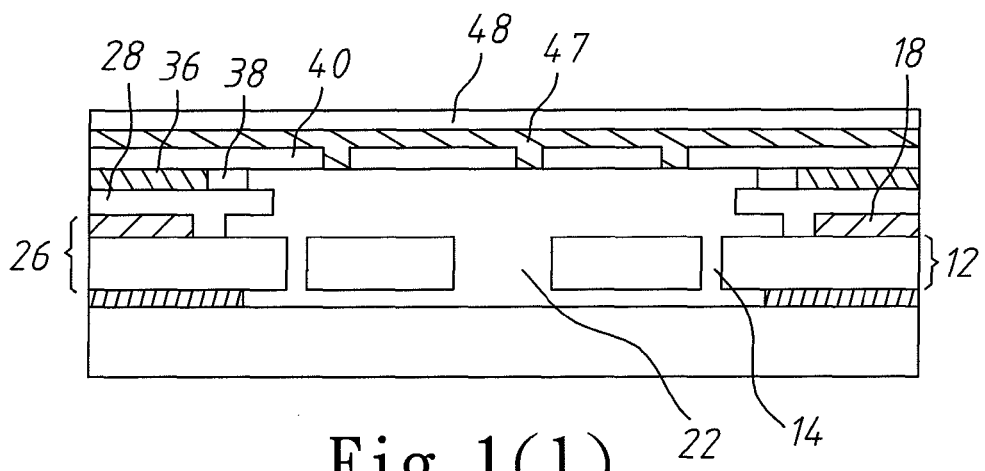
Figure 1M:
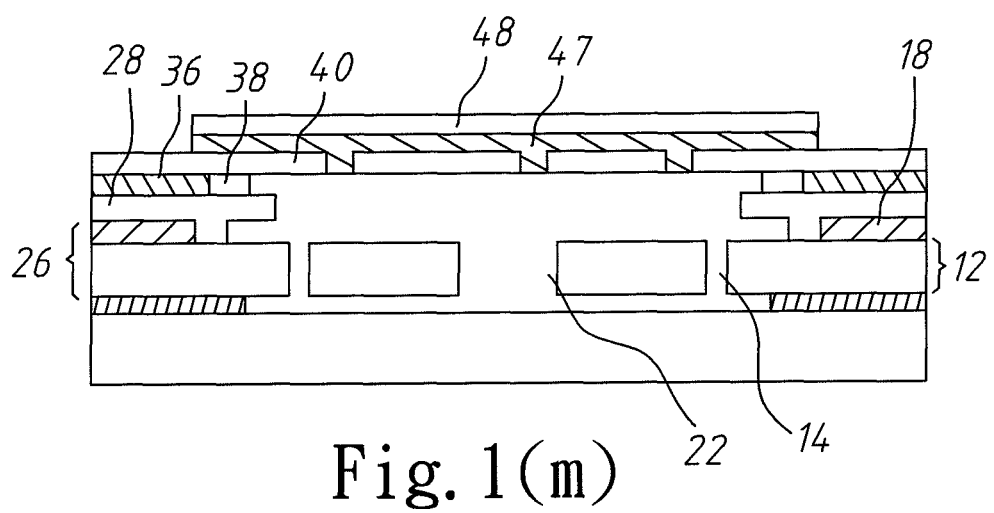

Subsequently, as shown in FIG. 1(l), deposit at least an insulation layer 47 and a metal layer 48 on the second metal layer 40 of the conduction wiring layer 45, to seal off the hole 42. Finally, as shown in FIG. 1(m), remove a part of the metal layer 48 and the insulation layer 47 below, to expose the second metal layer 40 used for electrical conduction.

The step in FIG. 1(a) mentioned above can be omitted, namely provide directly an SOI substrate 10 containing a silicon layer 12 having a trench 14, as shown in FIG. 1(b). In addition, after the step of FIG. 1(b), a patterned via 22 can be formed directly in the silicon layer 12, and the sacrifice layer 26 is formed on the silicon layer 12, to fill the trench 14 and the patterned via 22, so as to complete the structure as shown in FIG. 1(e). Moreover, after the step as shown in FIG. 1(f), the conduction wiring layer 45 can be formed directly on the sacrifice layer 26.

In the following, the second embodiment is described. Refer to FIGS. 2(a) to 2(l) for the cross section views of structures corresponding to various steps of a sensor manufacturing method according to a second embodiment of the present invention. Wherein, the steps of FIGS. 2(a) to 2(j) are the same as those of FIGS. 1(a) to 1(j), and they will not be repeated here for brevity.

Figure 2A:
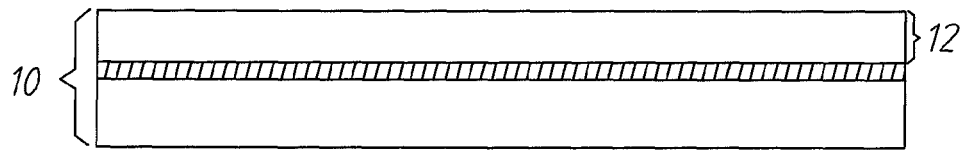
FIGS. 2(a) to 2(l) are cross section views of structures corresponding to various steps of a sensor manufacturing method according to a second embodiment of the present invention.
Figure 2B:
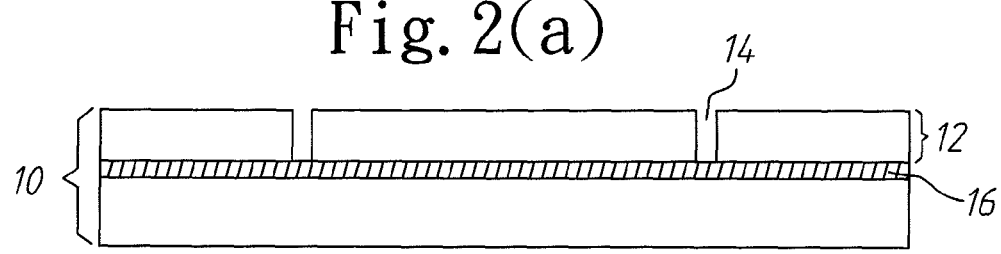
Figure 2C:
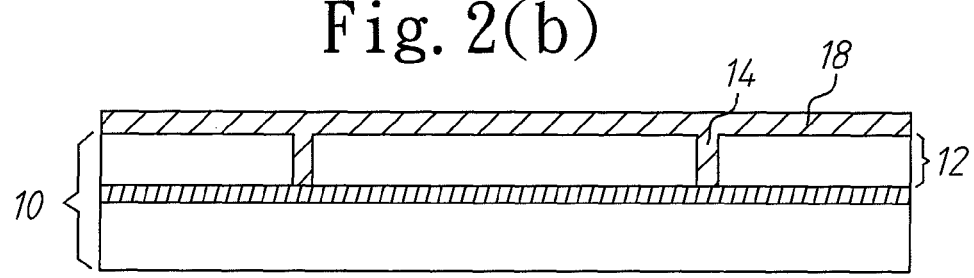
Figure 2D:
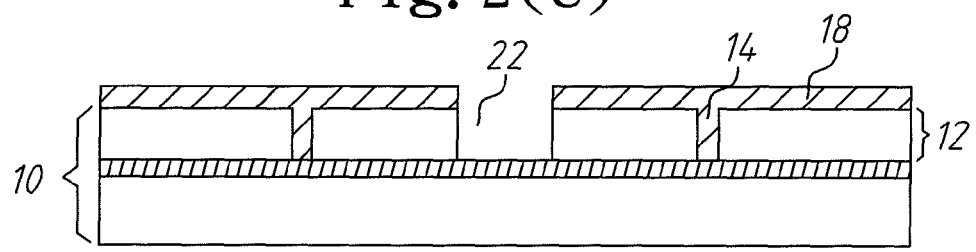
Figure 2E:
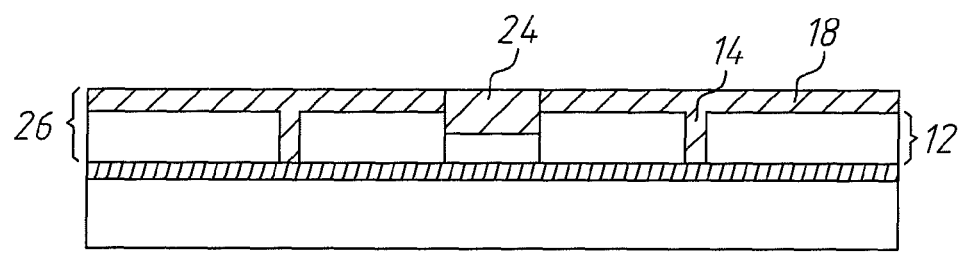
Figure 2F:
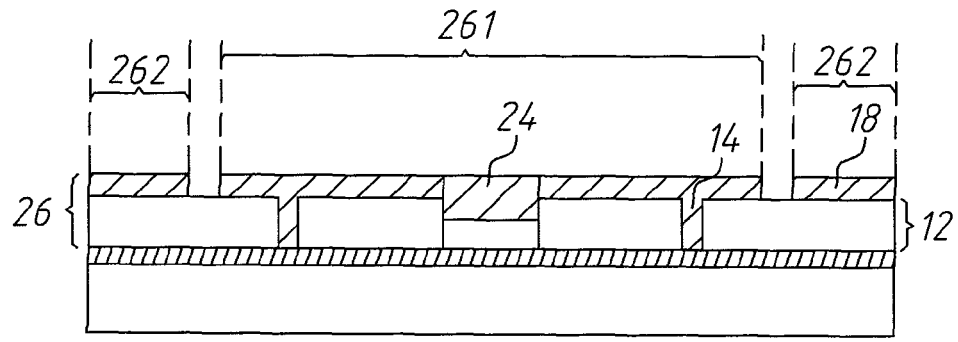
Figure 2G:
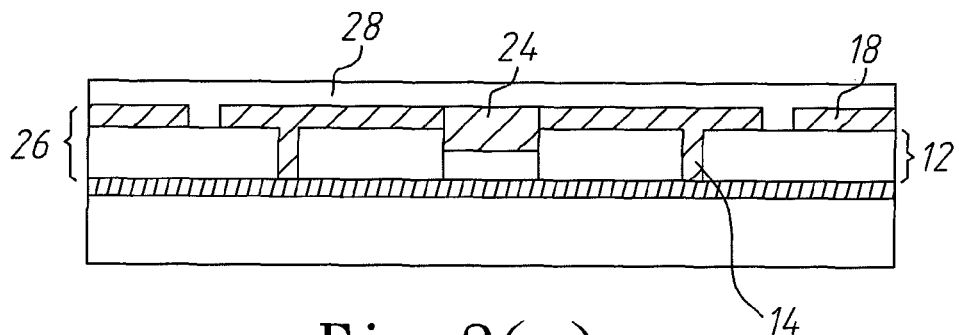
Figure 2H:
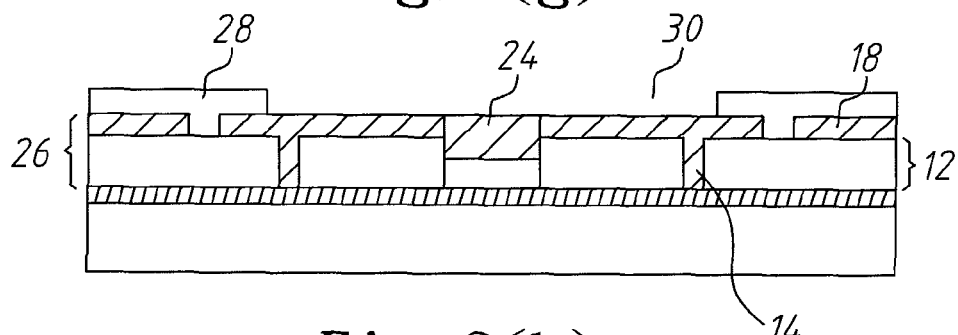
Figure 2I:
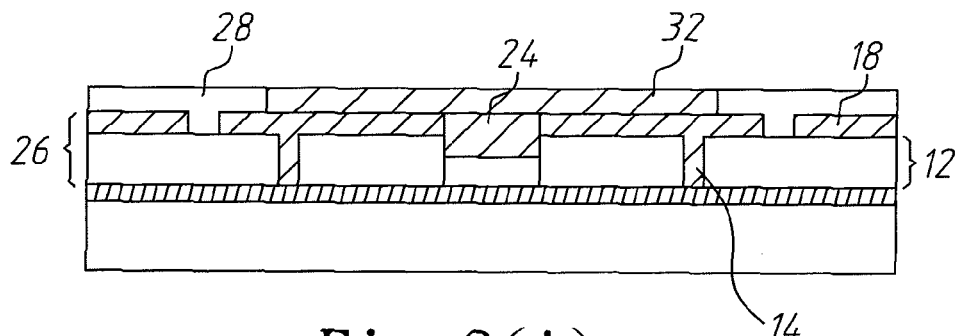
Figure 2J:
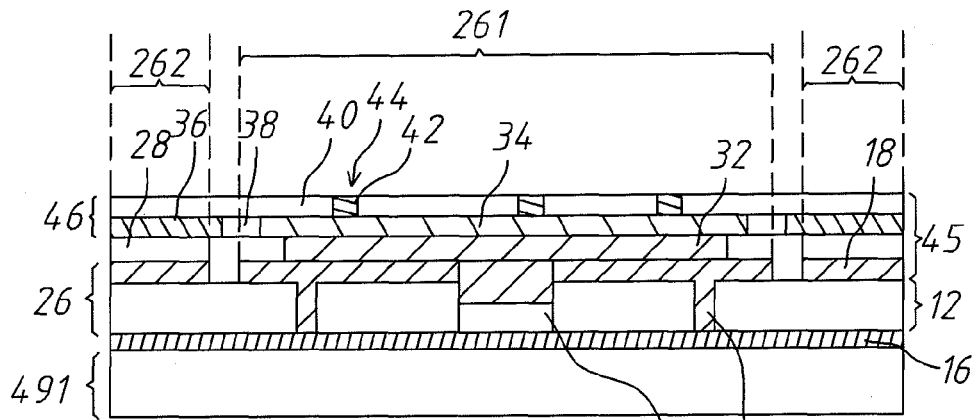
Figure 2K:
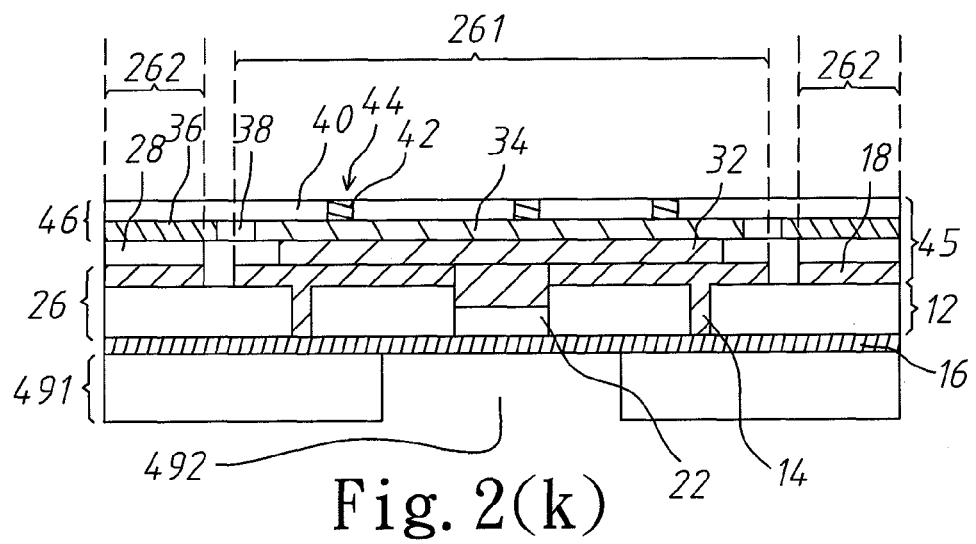
Figure 2L:
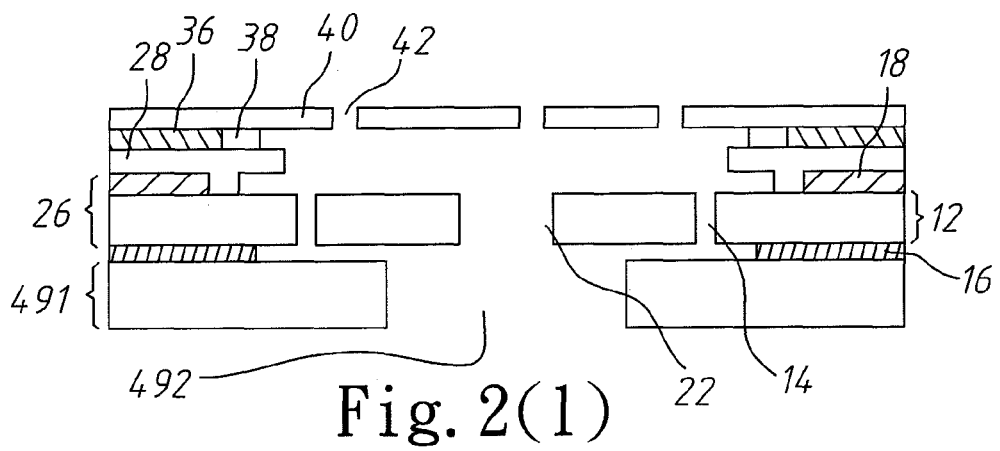

Upon completing the steps of FIG. 2(j), then as shown in FIG. 2(k), utilize Induced Coupling Plasma (ICP) to etch the backplane silicon substrate 491, to form an opening 492 exposing the silicon dioxide layer 16. The position of opening 492 corresponds to that of the patterned via 22. Then, as shown in FIG. 2(l), use Hydrogen Fluoride (HF) vapor through the hole 42, or utilize wet etching through the hole 42, to remove in sequence the second insulation layer 44, the first insulation block 34, the first insulation layer 32, the sacrifice layer 26 inside the first metal layer 28, the sacrifice layer 26 in the patterned via 22, and the silicon dioxide layer 16 of the silicon-on-insulator (SOI) substrate 10. Meanwhile, remove the sacrifice layer 26 in the trench 14, so that the opening 492 connects with the patterned via 22. The sacrifice layer 26 removed mentioned above is the part of the first sacrifice block 261.

Figure 3:
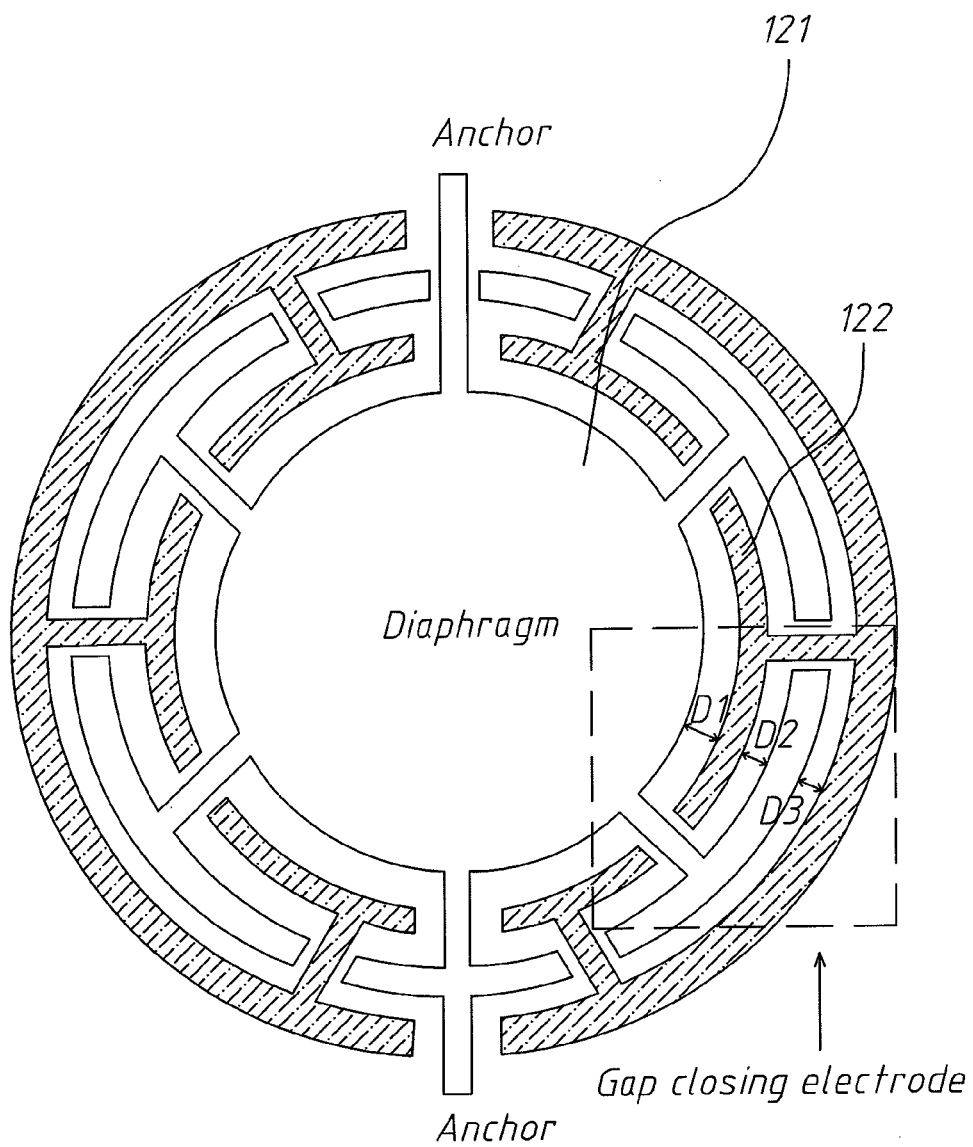
FIG. 3 is a top view of a microphone structure made by sensor manufacturing method according to a second embodiment of the present invention.

Up to this point, a microphone, a potential meter, or a non-seal packaged MEMS element can be produced. A capacitor type microphone without backplane can be designed based on the second embodiment as shown in FIG. 3, and that is also the top view of the silicon layer 12 of FIG. 2(l), indicating a microphone structure. In this figure it shows two electrodes of different potentials, shown respectively by cross section dash lines and blanks. The cross section dash lines indicate the electrode is a stator electrode, while the blank indicates the electrode is a rotor electrode. For the microphone structure, in addition to the silicon substrate 491 having the opening 492, it further includes the silicon layer 12 on the silicon substrate 491. The silicon layer 12 includes at least a first silicon block 121 serving as a rotor electrode, and at least a second silicon block 122 serving as a stator electrode. The first silicon block 121 and the second silicon block 122 are separated by at least two different co-planar gaps, such that the co-planar gaps connect with the opening 492. Wherein, the portion of the first silicon block 121 is used as a vibration diaphragm, and is located inside the second silicon block 122.

The stator electrode and the rotor electrode are separated by co-planar gaps D1, D2, and D3, to form horizontal type capacitor structure, while the co-planar gaps D1, D2, and D3 are for example 1.5 μm, 3 μm, and 1.5 μm respectively. In other words, when a voltage is applied between the stator electrode and the rotor electrode to perform acoustic pressure sensing, the sensor electrode of the microphone will produce capacitance variations, and the capacitance sensing is referred to as gap closing sensing. Its structure is simpler, capable of saving quite a few production steps, as compared with the ordinary capacitor type microphone requiring vertical type capacitor structure of diaphragm, backplane, and cavity.

In the following, the third embodiment of the present invention is described. Refer to FIGS. 4(a) to 4(l) for cross section views of structures corresponding to various steps of a sensor manufacturing method according to a third embodiment of the present invention.

Figure 4A:
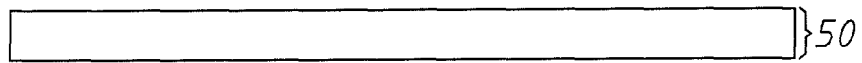
FIGS. 4(a) to 4(l) are cross section views of structures corresponding to various steps of a sensor manufacturing method according to a third embodiment of the present invention.
Figure 4B:
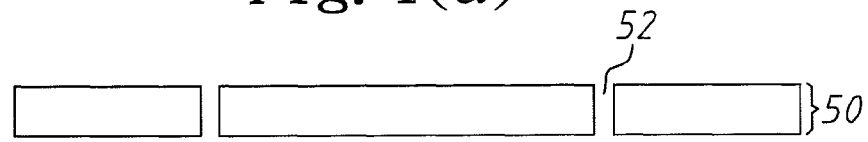
Figure 4C:
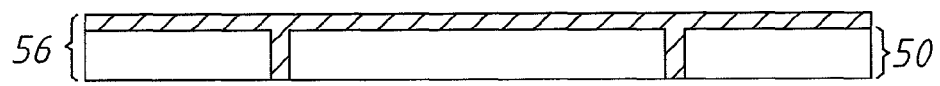
Figure 4D:
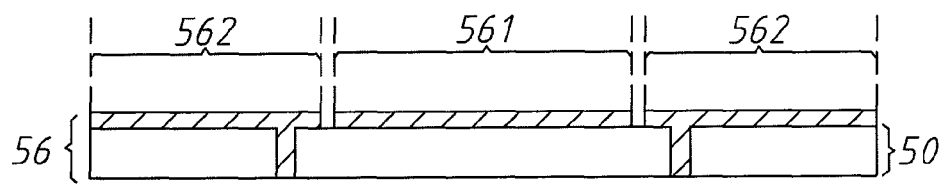

Firstly, as shown in FIG. 4(a), provide a silicon substrate 50. Next, as shown in FIG. 4(b), utilize deep reactive-ion etching to form at least a trench 52 through the silicon substrate 50. Next, as shown in FIG. 4(c), use thermal oxidation method or PECVD to form a sacrifice layer 56 made of silicon dioxide on the silicon substrate 50, to fill the trench 52. Then, as shown in FIG. 4(d), remove a part of the sacrifice layer 56, to expose the silicon substrate 50, so that the sacrifice layer 56 has a first sacrifice block 561 and a second sacrifice block 562, and the second sacrifice block 562 is on the outer perimeter of the first sacrifice block 561. Wherein, for the requirement of the subsequent conduction wiring layer, adjustment can be made in the manufacturing process, such that the first sacrifice block 561 is made of silicon dioxide, while the second sacrifice block 562 is made of silicon dioxide, silicon carbide, or polysilicon of high impedance.

Figure 4E:
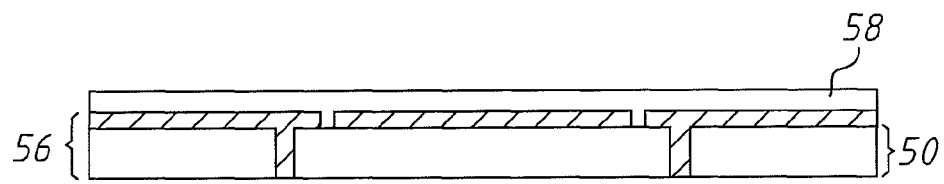
Figure 4F:
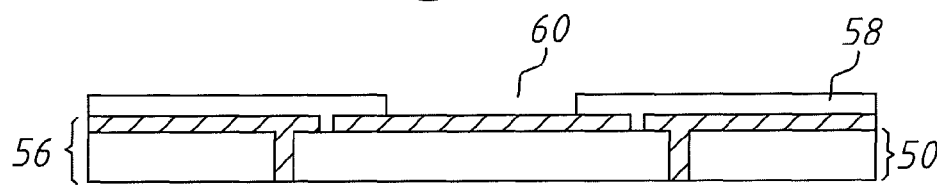
Figure 4G:
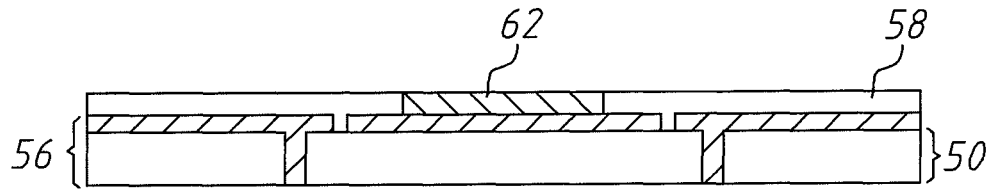
Figure 4H:
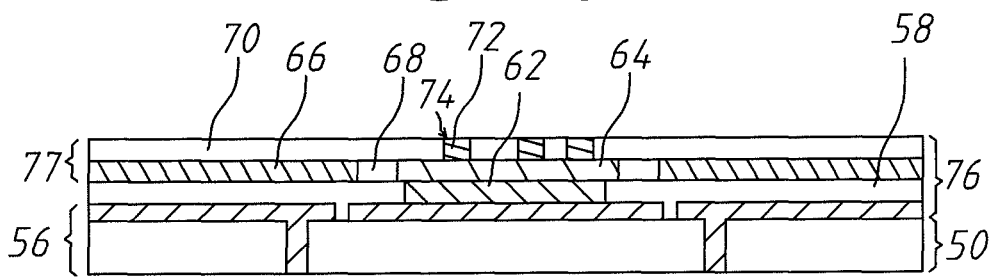

After the removal, as shown in FIG. 4(e), a second metal layer 58 made of aluminum is formed on the sacrifice layer 56, to connect electrically to the silicon substrate 50. Afterwards, as shown in FIG. 4(f), form at least an opening 60 in the second metal layer 58 corresponding to the sacrifice layer 56 inside the second metal layer 58, to expose the sacrifice layer 56. Then, as shown in FIG. 4(g), form a second insulation layer 62 made of silicon dioxide to fill the opening 60. After filling, as shown in FIG. 4(h), form a first insulation block 64 made of silicon dioxide on the second insulation layer 62, and form a second insulation block 66 made of silicon dioxide and a metal block 68 made of tungsten (W) on the first metal layer 58. The metal block 68 is used as a conduction via or conduction plug, such that the first insulation block 64, the second insulation block 66 are adjacent to the metal block 68, and are located inside and outside of the metal block 68, to form a second metal layer 70 made of aluminum and having at least a hole 72, on the first insulation block 64, the second insulation block 66, and the metal block 68. Also, form a third insulation layer 74 made of silicon dioxide in the hole 72, and is located on the first insulation block 64, so that a conduction wiring layer 76 is formed on the sacrifice layer 56. Wherein, the hole 72 is located corresponding to the sacrifice layer 56 inside the conduction wiring layer, namely the first sacrifice block 561.

Alternatively, as shown in the step of FIG. 4(h), a metal wiring layer 77 having an hole 72 and including the first insulation block 64, the second insulation block 66, the metal block 68, the second metal layer 70, and the third insulation layer 74 can be formed directly on the second insulation layer 62 and the first metal layer 58. Wherein, the relative positions of the first insulation block 64, the second insulation block 66, the metal block 68, the second metal layer 70, and the third insulation layer 74 are the same as that mentioned above.

Figure 4I:
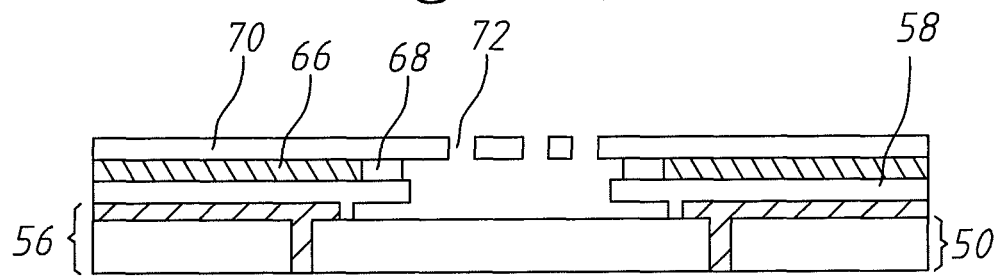
Figure 4J:
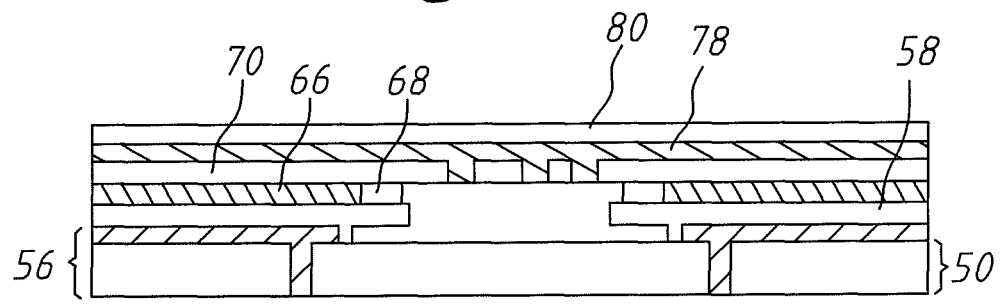
Figure 4K:
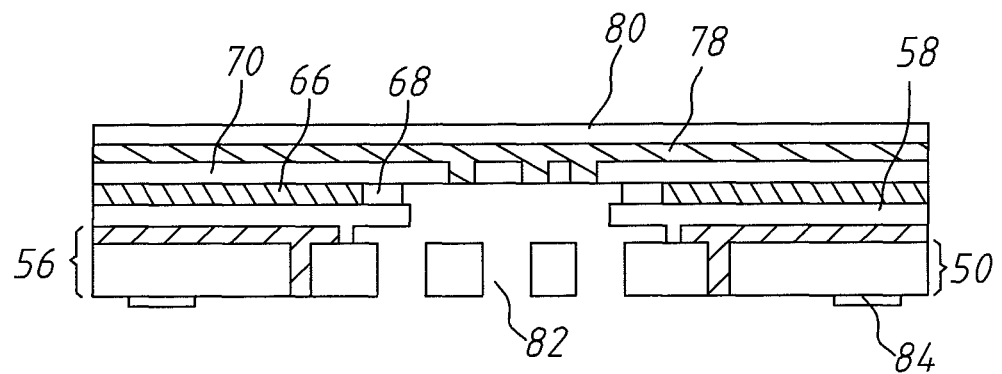
Figure 4L:
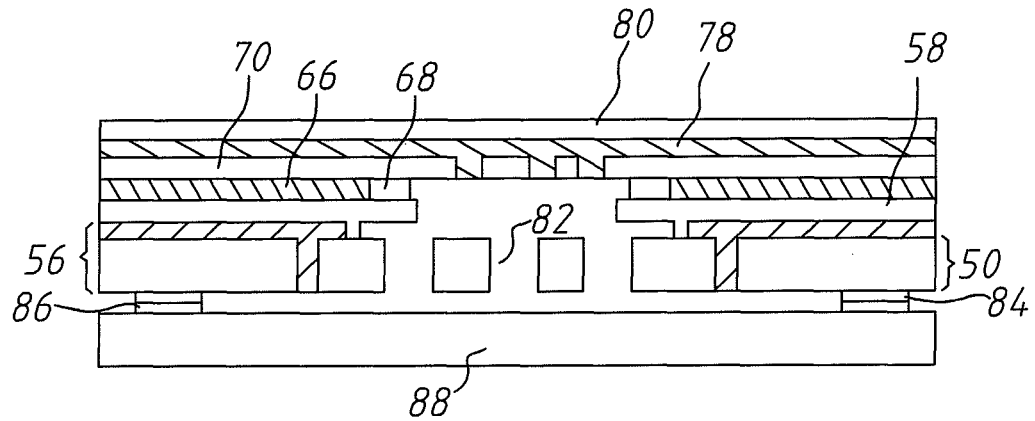
Figure 5A:
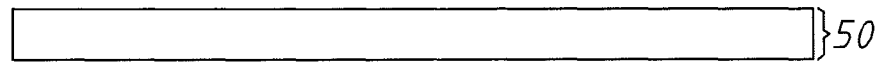
FIGS. 5(a) to 5(m) are cross section views of structures corresponding to various steps of a sensor manufacturing method according to a fourth embodiment of the present invention.
Figure 5B:
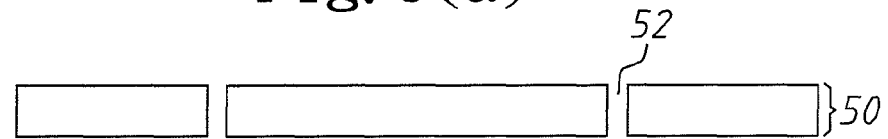
Figure 5C:
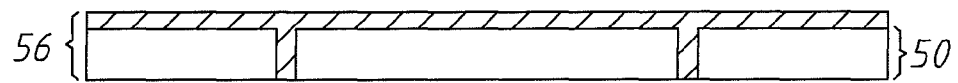
Figure 5D:
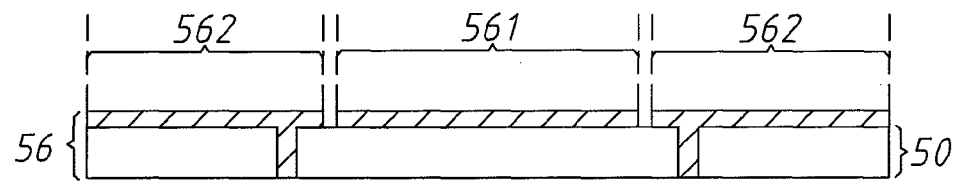
Figure 5E:
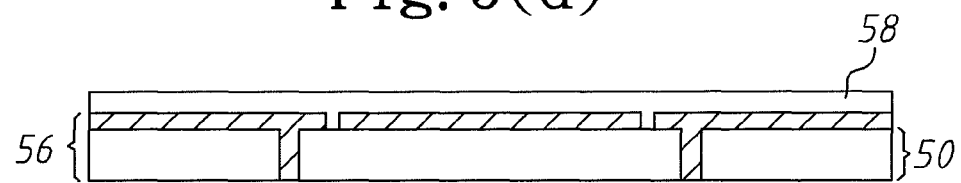
Figure 5F:
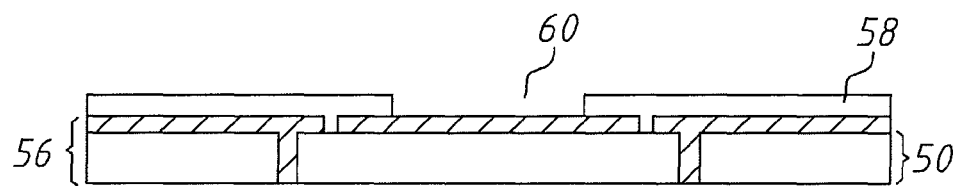
Figure 5G:
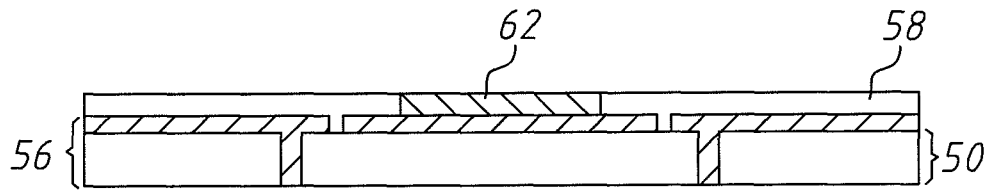
Figure 5H:
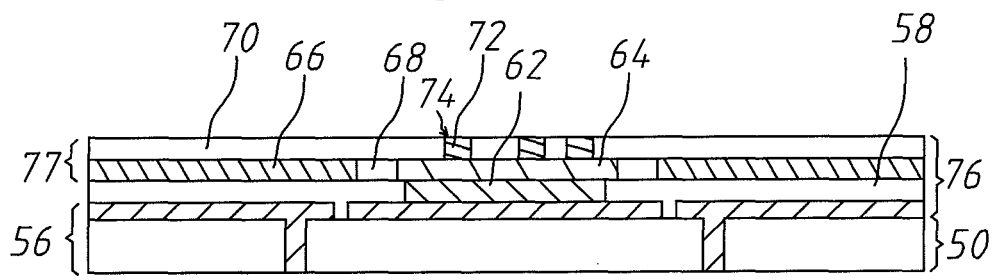
Figure 5I:
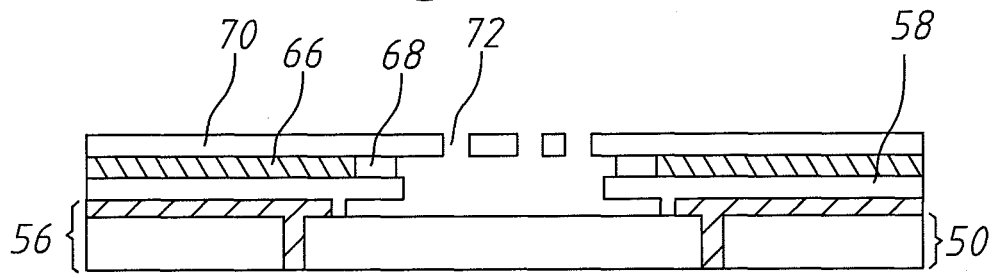
Figure 5J:
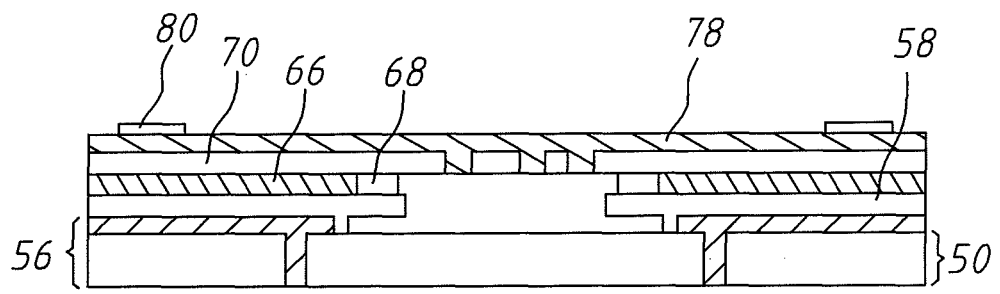
Figure 5K:
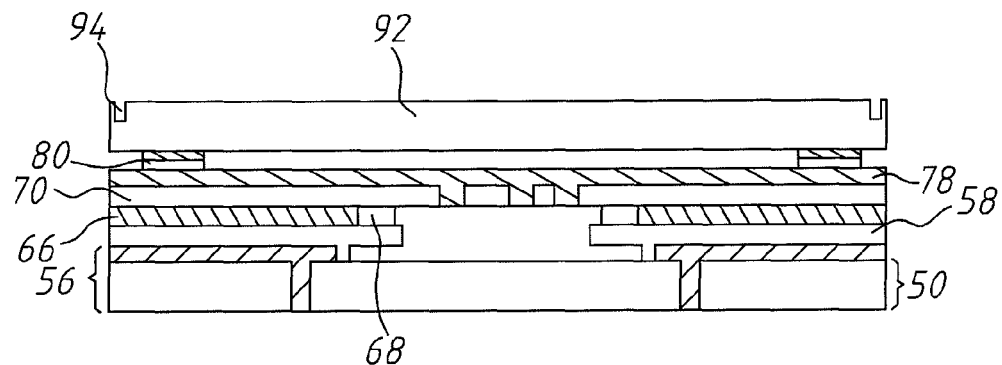
Figure 5L:
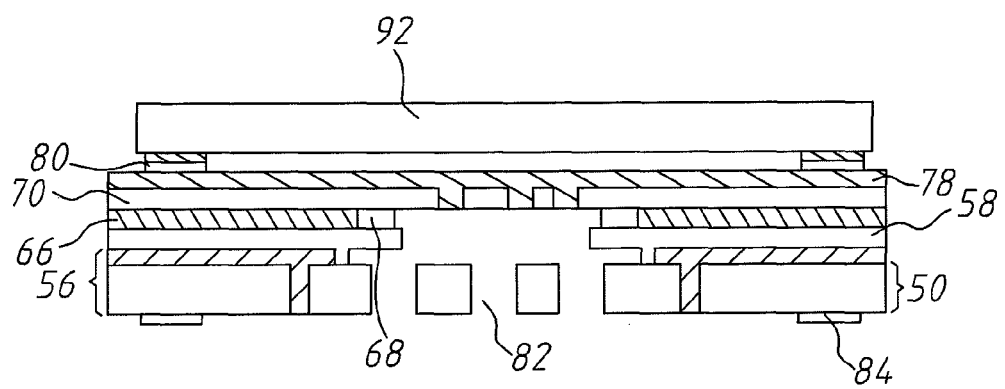
Figure 5M:
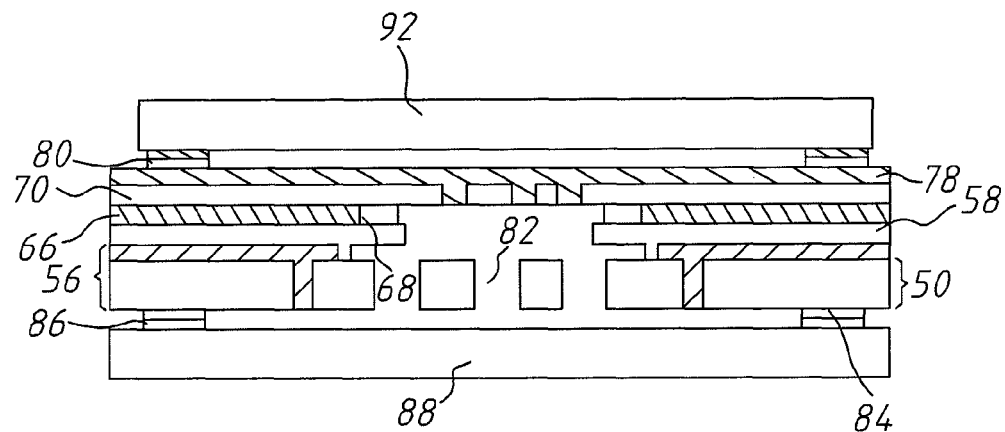

Then, as shown in FIG. 4(i), pour in the hydrofluoric acid vapor through the hole 72, or utilize wet etching of hydrofluoric acid liquid, to remove in sequence the third insulation layer 74, the first insulation block 64, the second insulation layer 62, the sacrifice layer 56 inside the first metal layer 58 of the conduction wiring layer 76. The sacrifice layer is the first sacrifice block 561. After the removal, as shown in FIG. 4(j), deposit in sequence the first insulation layer 78 made of silicon dioxide and a connection layer 80 made of aluminum on the second metal layer 70 of the conduction wiring layer 76, so as to seal off the hole 72. Then, as shown in FIG. 2(*k*), at a position corresponding to the hole 72, utilize the deep reactive-ion etching to form at least a patterned via 82 through the silicon substrate 50; and form at least a first connection pad 84 at the bottom surface of the silicon substrate 50. Finally, as shown in FIG. 4(*l*), provide at least a circuit chip 88 having at least a second connection pad 86, and utilize the bonding to each other of the first connection pad 84 and the second connection pad 86, to fix the circuit chip 88 onto the silicon substrate 50. The first connection pad 84 and the second connection pad 86 are connected in a hermetic way, and that belong to the fusion bonding, glass fit bonding, and eutectic bonding of the prior art. Wherein, in case the bonding technology is of a fusion bonding, then the step of forming the first connection pad 84 can be omitted, so that the second connection pad 86 is bonded directly onto the silicon substrate 50.

In the descriptions mentioned above, the step of FIG. 4(*a*) can be omitted, namely, to provide directly a silicon substrate 50 having a trench 52, as shown in FIG. 4(*b*). Furthermore, after the step of FIG. 4(*d*), the conduction wiring layer 76 can be formed directly on the sacrifice layer 56.

In addition, in the process flow of the third embodiment, after the step of FIG. 4(*i*), the steps of FIGS. 4(*j*) and 4(*l*), and the step of forming the first connection pad 84 of FIG. 4(*k*) can be omitted, to perform directly the step of forming patterned via 82 of FIG. 4(*k*), to complete the manufacturing process of the sensor.

In the following, the fourth embodiment of the present invention is described. Refer to FIGS. 5(*a*) to 5(*m*) for cross section views of structures corresponding to various steps of a sensor manufacturing method according to a fourth embodiment of the present invention. Wherein, the steps of FIGS. 5(*a*) to 5(*j*) are the same as those of FIGS. 4(*a*) to 4(*j*), and they will not be repeated here for brevity.

Upon forming the first insulation layer 78 and the connection layer 80 on the second metal layer 70 of the conduction wiring layer 76, as shown in FIG. 5(*k*), provide a support substrate 92, with its top surface provided with at least a slot 94 for aligning positions, and connect the support substrate 92 to the connection layer 80, for fixing the support substrate 92 onto the conduction wiring layer 76. Wherein, the support substrate 92 is realized with a silicon substrate.

Then, as shown in FIG. 5(*l*), at the position corresponding to the hole 72, utilize the deep reactive-ion etching, to form at least a patterned via 82 through the silicon substrate 50. Also, form at least a first connection pad 84 on the bottom of the silicon substrate 50, to remove the slot 94. Finally, as shown in FIG. 5(*m*), provide at least a circuit chip 88 having at least a second connection pad 86, and utilize the bonding of the first connection pad 84 and the second connection pad 86, to fix the circuit chip 88 onto the silicon substrate 50. Similarly, the first connection pad 84 and the second connection pad 86 are connected in a hermetic way, and that belongs to the fusion bonding, glass fit bonding, and eutectic bonding of the prior art. Wherein, in case the bonding technology is of fusion bonding, then the step of forming the first connection bonding 84 can be omitted, so that the second connection pad 86 is bonded directly onto the silicon substrate 50. Wherein, the first connection pad 84 and the second connection pad 86 can be made of silicon dioxide or metal.

Through the manufacturing processes mentioned above, various MEMS sensors, such as accelerator, gyroscope, magnetic field sensor, or oscillator etc. can be produced.

Summing up the above, the manufacturing technology of the present invention is stable, mature, and is capable of reducing cost and meeting the requirements of MEMS technology.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A sensor manufacturing method, comprising following steps:

provide a silicon-on-insulator (SOI) substrate, a silicon layer of said SOI substrate is penetrated with at least a trench;

form at least a patterned via through said silicon layer, and form at least a sacrifice layer on said silicon layer, to fill said trench and said patterned via;

remove part of said sacrifice layer, to expose said silicon layer, and form a first metal layer on said sacrifice layer, to connect it electrically to said silicon layer;

at a position corresponding to said patterned via, form at least an opening in said first metal layer, to expose said sacrifice layer, and form a first insulation layer to fill said opening; and form a first insulation block on said first insulation layer, form a second insulation block and a metal block on said first metal layer, such that said first insulation block and said second insulation block are adjacent to said metal block, and are located respectively inside and outside said metal block to form a second metal layer having at least a hole with its position corresponding to that of said patterned via on said first insulation block, said second insulation block, and said metal block, and form a second insulation layer in said hole to be located on said first insulation block; and through said hole, remove said sacrifice layer in said patterned via.

2. The sensor manufacturing method as claimed in claim 1, wherein in said step of forming said patterned via in said silicon layer, forming said sacrifice layer on said silicon layer, and filling said trench and said patterned via further includes following steps:

utilize thermal oxidation method or plasma enhanced chemical vapor deposition (PECVD) to form an oxidation layer on said silicon layer, to fill said trench;

remove part of said oxidation layer and said silicon layer below, to form said patterned via; and fill a sacrifice structure in said patterned via, and form said sacrifice layer on said silicon layer.

3. The sensor manufacturing method as claimed in claim 1, wherein in said step of removing said sacrifice layer in said patterned via through said hole, remove in sequence said second insulation layer, said first insulation block, said first insulation layer, said sacrifice layer inside said first metal layer, said sacrifice layer in said patterned via, and a silicon oxide layer on said SOI substrate, wherein, said first insulation layer, said second insulation layer, said first insulation block, and said second insulation block are made of silicon dioxide.

4. The sensor manufacturing method as claimed in claim 1, wherein deep reactive-ion etching is used to form said patterned via, position of said hole corresponds to that of said trench, and in said step of removing said sacrifice layer in said patterned via through said hole, remove at the same time said sacrifice layers in said trench and said patterned via; and in said step of removing said part of said sacrifice layer to expose said silicon layer, remove said part of said sacrifice layer to expose said silicon layer, such that said sacrifice layer has a first sacrifice block and a second sacrifice block, and said second sacrifice block is on an outer perimeter of said first sacrifice block, said first sacrifice layer is made of silicon dioxide, while said second sacrifice block is made of silicon dioxide, silicon carbide, or undoping polysilicon.

5. The sensor manufacturing method as claimed in claim 1, wherein in said step of removing said sacrifice layer in said patterned via through said hole, use Hydrogen Fluoride (HF) vapor through said hole, or performing wet etching through said hole; and after said step of removing said sacrifice layer in said patterned via through said hole, a step of forming at least an insulation layer on said second metal layer, to seal off said hole is performed.

6. The sensor manufacturing method as claimed in claim 1, wherein after said step of forming said conduction wiring layer on said sacrifice layer, to connect it electrically to said silicon layer, form an opening in said silicon layer of said SOI substrate, to expose a silicon dioxide layer of said SOI substrate, and position of said opening corresponds to that of said patterned via; and in said step of removing said sacrifice layer in said patterned via through said hole, remove said sacrifice layer in said patterned via through said hole, so that said opening connects with said patterned via.

7. A sensor manufacturing method, comprising following steps:

provide a silicon substrate, that is provided with at least a trench penetrating through said silicon substrate;

form a sacrifice layer on said silicon substrate, to fill said trench;

remove a part of said sacrifice layer, to expose said silicon substrate, and form a first metal layer on said sacrifice layer, to connect it electrically to said silicon substrate;

at a position corresponding to said sacrifice layer inside said first metal layer, form at least an opening in said first metal layer, to expose said sacrifice layer, and form a second insulation layer to fill said opening;

form a metal wiring layer having at least a hole on said first metal layer and said second insulation layer, and position of said hole corresponds to that of said sacrifice layer on an inner side of said first metal layer;

through said hole, remove said sacrifice layer on said inner side;

form in sequence a first insulation layer and a connection layer on said conduction wiring layer, to seal off said hole; and at a position corresponding to said hole, form at least a patterned via penetrating through said silicon substrate.

8. The sensor manufacturing method as claimed in claim 7, wherein in said step of forming said metal wiring layer on said first metal layer and said second insulation layer, form a first insulation block on said second insulation layer, form a second insulation block and a metal block on said first metal layer, said first insulation block and said second insulation block are adjacent to said metal block, and are located respectively inside and outside said metal block, form a second metal layer having said hole on said first insulation block, said second insulation block, and said metal block, and form a third insulation layer in said hole to be located on said first insulation block, so that said metal wiring layer is formed on said first metal layer and said second insulation layer;

in said step of removing said sacrifice layer inside said conduction wiring layer through said hole, remove said third insulation layer, said first insulation block, said second insulation layer, said sacrifice layer on inner side of said first metal layer; and in said step of removing said part of said sacrifice layer to expose said silicon substrate, remove said part of said sacrifice layer to expose said silicon substrate, so that said sacrifice layer has a first sacrifice block and a second sacrifice block, and said second sacrifice block is on an outer perimeter of said first sacrifice block, such that said first sacrifice block is made of silicon dioxide, while said second sacrifice block is made of silicon dioxide, silicon carbide, or undoping polysilicon.

9. The sensor manufacturing method as claimed in claim 7, wherein said patterned via is formed through deep reactive-ion etching, and said sacrifice layer is formed by using thermal oxidation method or plasma enhanced chemical vapor deposition (PECVD), in said step of removing said sacrifice layer in said patterned via through said hole, use Hydrogen Fluoride (HF) vapor through said hole, or utilize wet etching through said hole; and after said step of forming said pattern via in said silicon substrate, at least a circuit chip is fixed onto said silicon substrate by means of hermetic bonding.

\* \* \* \* \*